United States Patent
Haider et al.

(10) Patent No.: US 9,916,118 B2
(45) Date of Patent: Mar. 13, 2018

(54) MEDICAL IMAGING SYSTEM AND OPERATING METHOD THEREFOR

(71) Applicant: Siemens Aktiengesellschaft, Munich (DE)

(72) Inventors: Sultan Haider, Erlangen (DE); Mathias Nittka, Baiersdorf (DE); Mario Zeller, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 127 days.

(21) Appl. No.: 15/042,186

(22) Filed: Feb. 12, 2016

(65) Prior Publication Data

US 2016/0239961 A1 Aug. 18, 2016

(30) Foreign Application Priority Data

Feb. 16, 2015 (DE) ........................ 10 2015 202 771

(51) Int. Cl.
*G06F 3/14* (2006.01)
*G01R 33/54* (2006.01)

(52) U.S. Cl.
CPC ............. *G06F 3/14* (2013.01); *G01R 33/543* (2013.01); *G09G 2380/08* (2013.01)

(58) Field of Classification Search
CPC ........ G06T 11/005; G06F 19/34; G06F 19/36; A61B 6/545; G01R 33/543; G01R 33/546
See application file for complete search history.

(56) References Cited

U.S. PATENT DOCUMENTS

| | | | |
|---|---|---|---|
| 6,690,961 B1 | 2/2004 | Kaufman et al. | 600/410 |
| 6,781,375 B2 | 8/2004 | Miyazaki et al. | 324/314 |
| 7,570,051 B2 | 8/2009 | Haider | 324/307 |
| 8,064,671 B2 | 11/2011 | Deimling et al. | 382/131 |
| 2007/0276220 A1 | 11/2007 | Harvey et al. | 600/410 |
| 2010/0321016 A1 | 12/2010 | Sugiura | 324/307 |
| 2012/0213326 A1* | 8/2012 | Walker et al. | 378/4 |
| 2014/0111199 A1 | 4/2014 | Oh et al. | G01R 33/56509 |
| 2016/0058426 A1* | 3/2016 | Hedlund et al. | A61B 8/54 600/410 |

FOREIGN PATENT DOCUMENTS

| | | | |
|---|---|---|---|
| JP | 2008302096 A | 12/2008 | A61B 5/055 |
| JP | 2009060939 A | 3/2009 | A61B 5/055 |

OTHER PUBLICATIONS

Zeller et al., "Density Weighted Turbo Spin Echo Imaging," Journal of Magnetic Resonance Imaging, vol. 37, pp. 965-973 (2013).

* cited by examiner

*Primary Examiner* — Andrew W Johns
(74) *Attorney, Agent, or Firm* — Schiff Hardin LLP

(57) ABSTRACT

In a medical imaging system and an operating method therefor, in order to simplify the operation of the medical imaging system, a framework condition for the creation of image information is selected on the basis of one or more acquisition sequences, and a computer of the imaging system automatically preselects multiple parameter sets for the at least one acquisition sequence as a function of the selected framework condition. For each of the preselected parameter sets, at least one characteristic from the acquisition sequence or from image information assigned to the acquisition sequence is visually presented. A parameter set is selected on the basis of the presented characteristic.

10 Claims, 2 Drawing Sheets

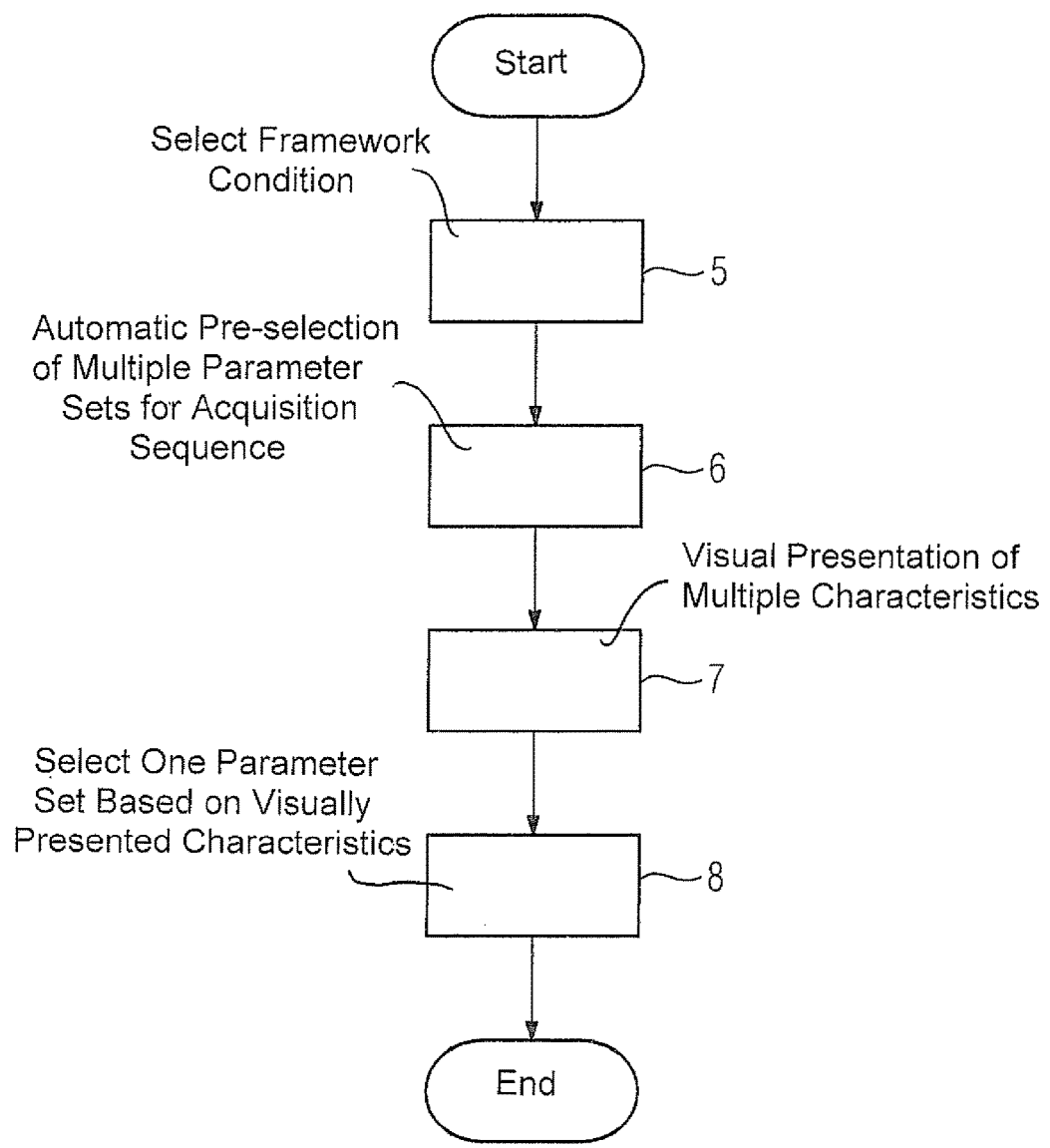

MEDICAL IMAGING SYSTEM AND OPERATING METHOD THEREFOR

BACKGROUND OF THE INVENTION

Field of the Invention

The invention concerns a method for operating a medical imaging system, in particular a magnetic resonance tomography system, as well as an operating apparatus for such a system, and a medical imaging system, in particular a magnetic resonance tomography system designed to implement such a method.

Description of the Prior Art

Medical imaging systems or devices, in particular magnetic resonance tomography systems or devices, can be automated to a large extent today. For example, standard parameter sets can be loaded into the device and activated automatically, a patient anatomy can be detected automatically, a slice geometry for the imaging can be configured automatically, and much more. However, the pre-prepared parameter sets for one or more corresponding acquisition sequences must still or should still be adapted by an operator in most cases. This is due to different or varying requirements of the radiologist, e.g. a selection of specific examination protocols for individual patients or a specific detail of a diagnostic inquiry. For example, an examination protocol might indicate whether a hip examination, a heart examination, or an examination of the brain is required, and which sectional views are desired in each case. In addition, the parameter sets must be adapted to anatomical factors of the respective patient, e.g. weight or height.

A lack of trained operating staff and experienced radiologists is prevalent in emerging or developing countries in particular. Owing to the normally high throughput rates in such environments, it is important in these installations to shorten the scan times of the systems, i.e. the temporal duration of the acquisition sequences resulting in the images or image information. In the case of short scan times in particular, a poorly selected parameter set results in unfavorable acquisition sequences and therefore often unusable image information. It is then necessary to repeat the examination using an optimized amended parameter set at considerable expense in terms of time, particularly in the case of more complex anatomical structures.

U.S. Pat. No. 7,570,051 B2 discloses a method for improving the contrast of images from magnetic resonance tomography, wherein the results of different acquisition sequences are combined.

U.S. Pat. No. 8,064,671 B2 discloses an imaging system in which non-linear contrast filters are used. These can be used to improve a visualization of contrasts.

SUMMARY OF THE INVENTION

An object of the present invention is to simplify the operation of a medical imaging system.

The invention relates to a method for operating a medical imaging system, in particular a magnetic resonance tomography system. This method includes a series of steps, beginning with the selection of a framework condition for the creation of image information on the basis of one or more acquisition sequences. The framework condition can be an examination protocol, for example. A framework condition in the form of an examination protocol involves e.g. a hip examination with a T1 sagittal and a proton density (PD) fat-saturated coronary acquisition sequence. The framework condition can be used to apply standard values to parameters of a subset, which are no longer changed, or are no longer permitted to be changed, during the subsequent course of the method. The framework condition can also be used to apply standard values to parameters of a subset, which are or are permitted to be changed during the subsequent course of the method. These parameters that can be changed during the course of the method then belong to the parameter sets described in the next paragraph. The selection of the framework condition may be performed by an operator making an entry via an input interface of a control computer of the imaging system, or automatically by the computer of the imaging system, e.g. by accessing a hospital database containing treatments to be carried out and associated examination protocols.

The next step is an automatic preselection by the computer of the imaging system, as a function of the selected framework condition, of a parameter set or multiple parameter sets for the at least one acquisition sequence. A parameter set can include one or more technical parameters of the imaging system or device (scanner), which can be set for the system or device. The next step is a visual presentation, at a display screen in communication with the computer, of at least one characteristic from the acquisition sequence, or a characteristic from image information assigned to the acquisition sequence, for the respective preselected parameter set or preselected parameter sets. An identical characteristic or multiple identical characteristics can therefore be visually presented, preferably simultaneously, for all preselected parameter sets. In this case, the characteristic can represent a desired aspect or a desired objective of the acquisition sequence or the image information. In a further step of the method, a selection of the preselected parameter set or one of the preselected parameter sets is made on the basis of the presented characteristic. This selection can also be an activation of the system via the computer using the selected parameter set.

The method has the advantage that the operator does not have to set the technical parameters of the parameter sets directly, the parameters often having an almost unpredictable effect on resulting image information due to the complexity of the systems. Instead of setting the technical parameters directly, the operator sets the technical parameters indirectly by selecting one of the preselected parameter sets on the basis of the presented characteristic. Since the respective characteristic or characteristics generally adopt different forms for different parameter sets, a preferred parameter set can be selected in a simple manner from all of the preselected parameter sets by the operator on the basis of their preferred form of a characteristic, i.e. without specific technical knowledge. The operator therefore directly sets a desired result, and only indirectly sets a specific operating mode of the system. By contrast, the usual procedure is the reverse, because the desired result is normally sought indirectly by directly setting the specific operating mode of the system. However, the results are considerably easier to comprehend and understand, and are more familiar in terms of their attributes than the parameter sets per se. Consequently, even less trained or less experienced operators can accurately set the optimal acquisition sequence in a simple manner. Simplified use and operation of the medical imaging system is therefore achieved. Moreover, it can also be quicker to set the system in this way.

In an embodiment, the characteristic for the respective preselected parameter sets is one or more of the following clinical parameters: a temporal duration of the acquisition sequence, a specific absorption rate which is assigned to the acquisition sequence for a specified patient, a resolution of image information assigned to the acquisition sequence, and a contrast or contrast ratio of image information assigned to the acquisition sequence. The resolution and/or contrast or contrast ratio of the image information may also relate to an image that can be created from the image information, and therefore includes the resolution and/or contrast or contrast ratio of the image. If the characteristic is the specific absorption rate that is assigned to the acquisition sequence for a specified patient, it is also possible to simultaneously provide the operator with information about limitations with respect to the acquisition sequences and/or image information assigned thereto, that results from this specific absorption rate. The characteristic may also include further clinical parameters, i.e. variables that relate to a result of the examination or acquisition sequence, but in particular do not or do not directly relate to the manner in which the acquisition sequence is executed and/or configured. This has the advantage that the information or results that are relevant or achievable for a diagnosis that is made on the basis of image information are used for the selection of the parameters for the imaging system. Therefore only a small amount of technical knowledge is required on the part of the operator. The system is particularly easy to operate.

In a further embodiment, the automatic preselection relates to precisely one parameter set having precisely one parameter, and for the framework condition to correspond to the one parameter. In this way, it is possible in the context of the method to realize a sort of preview function for the one parameter. By virtue of the framework condition corresponding to the one parameter, and the visually presented characteristic then being directly selectable via the framework condition, the operator can see the effect of the one parameter on the characteristic. This has the advantage that, even when deliberately setting a specific technical parameter, the operator has a visual impression of this setting on a result of the examination or on the examination.

In a further embodiment, a trial acquisition sequence is acquired before the automatic preselection, and information obtained from the trial acquisition sequence then being taken into consideration for the automatic preselection. In particular, the information that is obtained may relate to anatomical attributes of the specified patient, and/or to a location (i.e. a position and/or orientation) of the specified patient. This has the advantage that the preselected parameter sets are optimized for the respective individual patient, and there is little or no requirement for fine tuning or readjustment by the operator.

In another embodiment, the visual presentation of the respective characteristic from image information assigned to the acquisition sequence is a presentation of a respective specified reference image. The reference image can be stored in a database here, and represent the form of the respective characteristic that can be expected when the corresponding parameter sets are used. The effect of the assigned parameter set on the form of the characteristic is therefore clearly shown by the reference image. This has the advantage that selection of one of the parameter sets is particularly easy, and the probable consequences of this selection are presented in a manner that is particularly easy for the operator to understand.

It is also possible for the specified reference image to be created on the basis of the trial acquisition sequence. This has the advantage that the effect of the respective preselected parameter sets on the image information can be understood particularly well by the operator, since the presentation relates to the specific situation. Therefore, the selection is again made easier.

An algorithm or a database may be used to determine which parameter sets can produce which desired results or forms of a characteristic. For example, the algorithm or database may indicate which contrast ratios can be achieved using which acquisition sequence for the specified framework conditions, i.e. using which parameter set, e.g. repetition time (TR), echo time (TE), field-of-view (FOV), flip angle, etc. The algorithm can also take into consideration the height, weight and further anatomical attributes of the specified patient, and the location of the specified patient.

In a further embodiment, information about artifacts is provided in the image information, namely information that describes or designates artifacts that are likely to occur with a specified probability when using the preselected and/or selected parameter set. This has the advantage that an operator is able to assess from the outset the expected reliability and hence the probability that, despite a well-selected parameter set, a further acquisition sequence is required. This contributes to simplifying the operation of the imaging system even further.

In another embodiment, information is emitted about a type or an attribute of a coil which is required for the acquisition sequence when using the preselected and/or selected parameter set, and/or about positioning of this coil in relation to the specified patient. The coil in this case may be part of the imaging system or may be linked thereto. This has the advantage that even parameter sets which require specific coils or specific positions of coils can be proposed, without the operator requiring any further knowledge in relation to the coils or the associated acquisition sequences. This increases the number of possible parameter sets and corresponding acquisition sequences while preserving ease of operation.

The invention also encompasses an operating apparatus for a medical imaging system or device, in particular for a magnetic resonance tomography system or device, having an interface, an analysis processor, a display screen, and a user interface. The interface is used in this case to select a framework condition for the creation of image information on the basis of one or more acquisition sequences. The analysis processor is configured to automatically preselect a parameter set or multiple parameter sets for the at least one acquisition sequence, as a function of the selected framework conditions. At the display screen, at least one characteristic from the acquisition sequence or from image information assigned to the acquisition sequence can be visually presented for each preselected parameter set or each of the preselected parameter sets. The user interface allows the selection of the preselected parameter set or one of the preselected parameter sets on the basis of the presented characteristic.

The invention also concerns a medical imaging system, in particular a magnetic resonance tomography system, having such an operating apparatus.

Advantages and embodiments of the operating apparatus and the imaging system correspond to the advantages and embodiments of the method.

All of the features and combinations of features cited in the description, and the features and combinations of features cited below in the description of the figures and/or in the figures alone, may be used not only in the respectively specified combination but also in other combinations or in isolation without departing from the scope of the invention. The invention is therefore considered also to encompass embodiments of the invention that are not explicitly shown or illustrated in the figures, but which nonetheless are derived from and can be generated from the illustrated embodiments by combinations of features.

BRIEF DESCRIPTION OF THE DRAWINGS

FIG. 2 is a flowchart of a further exemplary embodiment of the invention.

DESCRIPTION OF THE PREFERRED EMBODIMENTS

Figure 1:
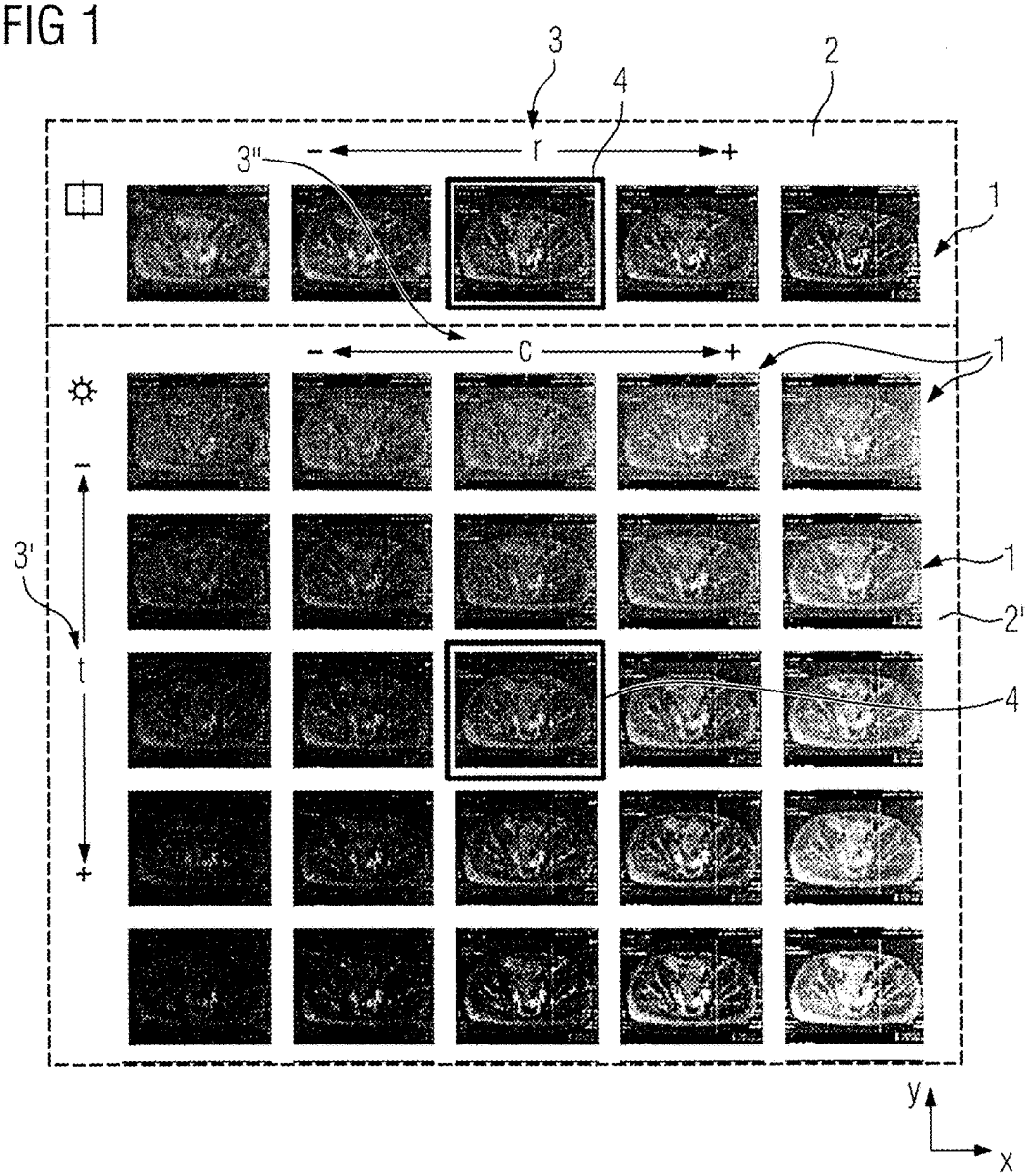
FIG. 1 shows a visual presentation of characteristics for a series of preselected parameter sets according to an exemplary embodiment of the invention.

In FIG. 1, multiple reference images 1 are arranged in the form of a matrix. A first region 2 contains a number of reference images 1, five in this case, which are arranged next to each other and represent different forms of a first characteristic 3, an achievable resolution r in this case. By selecting one of the respective reference images 1, an assigned parameter set is therefore selected which will probably, i.e. on the basis of all experience or according to stored data, result in the form of the first characteristic 3 which is represented by the selected reference image 1. The visual presentation is effected via a touch-sensitive display screen in this case, and therefore the selection can be made by tapping on the desired reference image 1. In the example shown, this selection is symbolized by a first outline 4.

The visual presentation here also includes multiple reference images 1 in a second region 2'. In this case, the reference images 1 in said second region are arranged next to and below each other in the form of a matrix, a 5×5 matrix in this case. Each of the reference images 1 here visualizes a form of two characteristics 3', 3" at the same time, here a time t as second characteristic 3' and a contrast c as third characteristic 3". The dimensions of the matrix correspond to the forms of the respective characteristic 3', 3" in this case. In the presentation shown, the contrast c that is achieved increases in a horizontal x-direction in this case, while the temporal duration required for the acquisition sequence increases in a negative y-direction. The operator is therefore given an overview of probably achievable results of the acquisition sequence or acquisition sequences, and merely has to select the reference image 1 on which the desired information that is relevant for a diagnosis is most clearly visible.

The actual configuration of the imaging system being used is then effected by means of the respective parameter set associated with the selected reference image 1. Here as well, a currently selected parameter set is identified by means of a second outline 4' around the relevant reference image 1, which represents the probable form of the presented characteristics 3', 3", here the contrast and time duration of the acquisition sequence. In the example shown, the acquisition sequence is therefore determined by the selection of two reference images 1, one in the first region 2 and one in the second region 2'. In this case, the reference images in the respective regions 2, 2' may be adapted to a selection that has already been made in the other region 2', 2 in each case. For example, the resolution of the reference images 1 in the second region 2' may be increased or decreased according to the selection in the first region 2.

In an exemplary embodiment of a method for operating a medical imaging system, an operator thus can therefore determine, firstly by selecting a specific examination protocol, a framework condition for the creation of image information and hence an image on the basis of one or more acquisition sequences. By virtue of the selection 5 (FIG. 2) of this framework condition, it is already possible to set standard parameter values, e.g. for the parameter sets that are used subsequently. The examination protocol may therefore involve e.g. a hip examination with two acquisition sequences, e.g. a T1 sagittal and a PD fat-saturated coronary acquisition sequence. After executing a trial acquisition sequence, for example, initial settings can be made. It is possible to determine e.g. a position and/or a location of the patient, and a field of view (FOV) that is to be examined. It is also possible to determine a number of slices that cover the region of the patient to be examined. It is also possible to make further settings, e.g. a radio frequency (RF) power limit or high-frequency (HF) transmission power in order to comply with a prescribed specific absorption rate for the patient, and further presettings.

For the purpose of automatically preselecting 6 (FIG. 2) a number of parameter sets for the at least one acquisition sequence, the computer of the imaging system can use, e.g., an algorithm database in order to determine optimal parameter sets with associated parameters from the specified framework conditions, i.e. for the examination protocol that has been requested or selected. These parameters may include e.g. a repetition time (TR), an echo time (TE), the number of slices, the flip angle, etc. These different parameter sets are presented to the operator as selection options, e.g. as shown FIG. 2. In the case of a corpulent patient, for example, it is therefore possible to propose either a short scan time with a lower resolution or a longer scan time with a higher resolution. Further options may also be provided for selection, e.g. the combination of a short scan time with a high resolution but using a different contrast ratio. This means that the operator does not have to be concerned with technical details, but can make a parameter selection from the preselected parameter sets on the basis of a desired result.

FIG. 2 shows a flowchart of an exemplary embodiment of the invention. A first step here is a selection 5 of a framework condition, e.g. an examination protocol with specified standard values for a range of parameters, for the creation of image information on the basis of one acquisition sequence in this case. By virtue of the framework condition, which is implemented e.g. as an examination protocol, the operator can specify e.g. a maximum duration of the acquisition sequence (scan time). A second step here is then an automatic preselection 6 by the computer of the imaging system, as a function of the previously selected framework condition, of multiple parameter sets for the one acquisition sequence. In this case, therefore, only parameter sets which probably result in a scan time of less than the specified maximum duration would be preselected. In this example, the preselected parameter sets comprise only a subset of all the parameters required for an acquisition sequence, the remaining parameters being determined by the standard values in this case. A third step is a visual presentation 7 of multiple characteristics 3 (FIG. 1) from image information assigned to the acquisition sequence in this case, or from the acquisition sequence, e.g. as shown in FIG. 1. In the example shown, respectively different variants of parameters for the acquisition sequence, and the corresponding different probable results, are then visually presented to the operator, wherein all of the variants satisfy the specified framework condition. Finally, a last step is a selection 8 of one of the preselected parameter sets on the basis of the presented characteristic 3. The operator therefore knows in this case that all preselected parameter sets satisfy the desired condition, and can select the best probable result without any particular technical knowledge.

In a further exemplary embodiment of the method (not shown), only one parameter set, containing only one parameter, is automatically preselected. In this case, the framework condition to be selected corresponds to this one parameter. In this way, it is possible to generate a preview image which presents the probable effect of the one parameter on the image information or the acquisition sequence. The preview image that is displayed can be based on previously collected patient data or on a reference image in this case.

The effect of a parameter that affects only the resolution can easily be simulated using common image processing methods. For example, a resolution of image information can be reduced by removing large Fourier factors in the Fourier (frequency) domain.

If the effect of a parameter on a result of the examination or on the examination depends on specific attributes of tissue types that are depicted, e.g. on specific relaxation times, the effect can be simulated in other ways. A first step here is to segment the image data into compartments for the different tissue types. This is generally either already done in the context of an examination, or can be done automatically by a corresponding algorithm.

Attributes, e.g. a proton density or relaxation times such as T1 or T2, can be allocated to each compartment, wherein the attributes correspond to the respective assigned tissue. The effect of a parameter can then be calculated for the different tissue types, taking into account the attributes that have been allocated.

For a spin-echo acquisition sequence, for example, the effect of the echo time TE or repetition time TR parameter on an image signal for a tissue type can be calculated using a factor $S=\rho*[1-\exp(-TR/T1)]*\exp(-TE/T2)$, wherein $\rho$ is the proton density and T1 and T2 are the respective relaxation times for the respective tissue type. The intensity or brightness of the pixels can then be adapted to the changed parameter in the respective compartments, by multiplying the intensity by the factor S. For more complex acquisition sequences and corresponding possibilities for simulating intensities and contrast behavior, reference is made here to the article "The loss of small objects in variable TE imaging: implications for FSE, RARE, and EPI" by Constable et al. in "Magnetic Resonance in the Medicine" (1992), 28:9-24. Alternatively, a Bloch simulation or a phase-graph-based approach may be used.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a medical imaging system, comprising:
    providing a computer with a designation of a selected framework condition for generating image information by operation of a medical imaging system using an image data acquisition sequence;
    in said computer, automatically preselecting at least one parameter set for said acquisition sequence dependent on the selected framework condition;
    at a display screen in communication with said computer, visually presenting at least one characteristic from the acquisition sequence, or from image information assigned to the acquisition sequence, for the at least preselected parameter set; and
    from said computer, selecting a final parameter set from said at least one preselected parameter sets, dependent on the visually presented characteristic, and making the final parameter set available as an electronic signal from the computer in a form for operating the medical imaging system.

2. A method as claimed in claim 1 comprising selecting said characteristic from the group consisting a temporal duration of the acquisition sequence, a specific absorption rate assigned to the acquisition sequence for a specified patient, a resolution of image information assigned to the acquisition sequence, and a contrast of image information assigned to the acquisition sequence.

3. A method as claimed in claim 1 comprising automatically preselecting only one parameter set that comprises only one parameter, and wherein said framework condition corresponds to said one parameter.

4. A method as claimed in claim 1 comprising before making said automatic preselection of said at least one parameter set, operating said medical imaging system according to a trial acquisition sequence and thereby obtaining trial acquisition sequence information, and using said trial acquisition sequence information in said computer to make said automatic preselection, said trial acquisition sequence information describing at least one of anatomical attributes of a patient, and a location of a patient in said medical imaging system.

5. A method as claimed in claim 1 comprising visually presenting said characteristic by presentation of a reference image.

6. A method as claimed in claim 1 comprising:
    before making said automatic preselection of said at least one parameter set, operating said medical imaging system according to a trial acquisition sequence and thereby obtaining trial acquisition sequence information, and using said trial acquisition sequence information in said computer to make said automatic preselection, said trial acquisition sequence information describing at least one of anatomical attributes of a patient, and a location of a patient in said medical imaging system; and
    visually presenting said at least one characteristic by displaying a reference image acquired from operation said medical imaging system with said trial acquisition sequence.

7. A method as claimed in claim 1 comprising visually presenting information, together with said at least one characteristic, describing a probability of image artifacts occurring when using either the preselected parameter set or the selected parameter set.

8. A method as claimed in claim 1 comprising visually presenting, together with said characteristic, information describing a characteristic of a coil, of said medical imaging system, that is required for use with either the preselected parameter set or the selected parameter set, said information being selected from the group consisting of a type of said coil, and positioning of said coil relative to a specified patient.

9. An operating apparatus for a medical imaging system, comprising:
    a computer provided with a designation of a selected framework condition for generating image information by operation of a medical imaging system using an image data acquisition sequence;
    said computer being configured to automatically preselect at least one parameter set for said acquisition sequence dependent on the selected framework condition;

a display screen in communication with said computer, said computer being configured to visually present, at said display screen, at least one characteristic from the acquisition sequence, or from image information assigned to the acquisition sequence, for the at least preselected parameter set; and said computer being configured to select a final parameter set from said at least one preselected parameter sets, dependent on the visually presented characteristic, and to make the final parameter set available as an electronic signal from the computer in a form for operating the medical imaging system.

10. A medical imaging system, comprising:

a medical imaging data acquisition scanner;

a computer provided with a designation of a selected framework condition for generating image information by operation of a medical imaging system using an image data acquisition sequence;

said computer being configured to automatically preselect at least one parameter set for said acquisition sequence dependent on the selected framework condition;

a display screen in communication with said computer, said computer being configured to visually present, at said display screen, at least one characteristic from the acquisition sequence, or from image information assigned to the acquisition sequence, for the at least preselected parameter set; and said computer being configured to select a final parameter set from said at least one preselected parameter sets, dependent on the visually presented characteristic, and to make the final parameter set available as an electronic signal from the computer in a form for operating the medical imaging system.

* * * * *